US009285690B2

(12) United States Patent
Banine et al.

(10) Patent No.: US 9,285,690 B2
(45) Date of Patent: Mar. 15, 2016

(54) MIRROR, LITHOGRAPHIC APPARATUS AND DEVICE MANUFACTURING METHOD

(75) Inventors: Vadim Yevgenyevich Banine, Deurne (NL); Leonid Aizikovitch Sjmaenok, Vaals (NL); Andrei Mikhailovich Yakunin, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 688 days.

(21) Appl. No.: 13/002,854

(22) PCT Filed: Jul. 16, 2009

(86) PCT No.: PCT/EP2009/059178
§ 371 (c)(1),
(2), (4) Date: Jan. 6, 2011

(87) PCT Pub. No.: WO2010/018046
PCT Pub. Date: Feb. 18, 2010

(65) Prior Publication Data
US 2011/0228243 A1  Sep. 22, 2011

Related U.S. Application Data

(60) Provisional application No. 61/089,296, filed on Aug. 15, 2008.

(51) Int. Cl.
*G03B 27/54* (2006.01)
*G03F 7/20* (2006.01)
(Continued)

(52) U.S. Cl.
CPC ............. *G03F 7/70958* (2013.01); *B82Y 10/00* (2013.01); *G03F 7/70575* (2013.01); *G21K 1/062* (2013.01)

(58) Field of Classification Search
CPC .................. G03F 7/70575; G03F 7/70958
USPC ................. 355/55, 67, 77; 359/883, 591, 574
See application file for complete search history.

(56) References Cited

U.S. PATENT DOCUMENTS 5,581,605 A * 12/1996 Murakami et al. .............. 378/84
6,807,008 B2    10/2004 Mitamura
(Continued)

FOREIGN PATENT DOCUMENTS

CN    1576903 A    2/2005
CN    1721171 A    1/2006
(Continued)

OTHER PUBLICATIONS

International Preliminary Report on Patentability and Written Opinion, The International Bureau of WIPO, directed to related International Patent Application No. PCT/EP2009/059178, mailed Feb. 15, 2011; 7 pages.

(Continued)

*Primary Examiner* — Peter B Kim
(74) *Attorney, Agent, or Firm* — Sterne, Kessler, Goldstein & Fox P.L.L.C.

(57) ABSTRACT

Embodiments of the invention relate to a mirror (30). The mirror includes a mirroring surface and a profiled coating layer (32a) having an outer surface, wherein one or more wedged elements are formed by the outer surface with respect to the mirroring surface, and wherein the one or more wedged elements having a wedge angle (ø) in a range of approximately 10-200 mrad. The profiled coating layer may have a curved outer surface. The profiled coating layer may be formed from at least one of the following materials: Be, B, C, P, K, Ca, Sc, Br, Rb, Sr, Y, Zr, Ru, Nb, Mo, Ba, La, Ce, Pr, Pa and U.

13 Claims, 6 Drawing Sheets

(51) Int. Cl.
*B82Y 10/00* (2011.01)
*G21K 1/06* (2006.01)

(56) References Cited

U.S. PATENT DOCUMENTS

| | | | |
|---|---|---|---|
| 7,136,141 | B2 | 11/2006 | Bakker |
| 7,382,436 | B2 | 6/2008 | Bakker |
| 7,773,196 | B2 | 8/2010 | Katsuhiko et al. |
| 2003/0058986 | A1* | 3/2003 | Oshino et al. .................. 378/34 |
| 2005/0122589 | A1* | 6/2005 | Bakker .......................... 359/591 |
| 2006/0012060 | A1 | 1/2006 | Hasei |
| 2006/0175556 | A1 | 8/2006 | Yabuki |

FOREIGN PATENT DOCUMENTS

| | | |
|---|---|---|
| EP | 1 496 521 A1 | 1/2005 |
| EP | 1 586 949 A2 | 10/2005 |
| EP | 1 930 771 A1 | 6/2008 |
| JP | 2004-085915 A | 3/2004 |
| JP | 2006-216917 A | 8/2006 |
| KR | 100697606 B1 * | 3/2007 ............... G02B 6/02 |
| TW | 200426525 A | 12/2004 |
| WO | WO 99/42904 A1 | 8/1999 |
| WO | WO 01/79915 A2 | 10/2001 |
| WO | WO 2005/119365 A2 | 12/2005 |
| WO | WO 2007/105406 A1 | 9/2007 |

OTHER PUBLICATIONS

International Search Report directed to related International Patent Application No. PCT/EP2009/059178, mailed Oct. 19, 2009, from the European Patent Office; 2 pages.

Zhou, Q., et al., "A method to fabricate convex holographic gratings as master gratings for making flat-field concave gratings," Proceedings of SPIE—Holographic and Diffractive Optics III, vol. 6832, 2007; pp. 68320W-1 to 68320W-9.

* cited by examiner

MIRROR, LITHOGRAPHIC APPARATUS AND DEVICE MANUFACTURING METHOD

BACKGROUND

1. Field

Embodiments of the present invention relate to a mirror, a lithographic apparatus and a method for manufacturing a device.

2. Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus the size of features that can be imaged onto the substrate is limited by the wavelength of the projection radiation. To produce integrated circuits with a higher density of devices, and hence higher operating speeds, it is desirable to be able to image smaller features. Recently, lithographic apparatus using extreme ultraviolet (EUV) radiation have been provided.

Some EUV sources, e.g. discharge produced plasma (DPP) or laser produced plasma (LPP) sources, emit radiation over a wide range of frequencies, even including infrared (IR), visible (VIS), ultraviolet (UV) and deep ultraviolet (DUV). These undesired frequencies, which may also be referred to as "further radiation", may propagate and cause heating problems in the illumination system and projection system of the lithographic apparatus and may cause undesired exposure of the resist if not blocked. Although the multilayer mirrors of the illumination and projection systems are optimized for reflection of the desired wavelength, e.g. about 6.7 nm or about 13.5 nm, they may be optically flat and have relatively high reflectance for IR, visible and UV wavelengths.

It is, therefore, necessary to select from the source a relatively narrow band of frequencies for the projection beam. Even where the source has a relatively narrow emission line, it may be advantageous to reject radiation out of that line, especially at longer wavelengths.

EP Application No. 1 496 521, incorporated herein by reference in its entirety, describes a lithographic apparatus comprising a multi-layer mirror provided with protrusions constructed to form a one dimensional or a two-dimensional diffraction pattern. As a result, the EUV radiation passes through these protrusions without any substantial absorption, while the undesired further radiation is substantially blocked due to absorption, refraction or deflection of this further radiation when impinged on the protrusions.

It is a disadvantage of the known lithographic apparatus that in order to form diffraction patterns, the protrusions, which are individually manufactured elements, have to be provided with high accuracy. This may unnecessarily increase manufacturing costs of the known multi-layer mirror. In addition, the known multi-layer mirror includes areas not covered by the material of the protrusions, for example in regions between the protrusions. Such areas, when exposed to a reactive environment, for example to an $H_2$ atmosphere of the lithographic apparatus, may be covered by contaminants. These contaminants may decrease reflectivity of the mirroring surface with respect to the EUV radiation and thereby degrade beam quality.

BRIEF SUMMARY

Given the foregoing, what is needed is a mirror, in particular, for use in an EUV-operable lithographic apparatus, which can be easily manufactured and which, in use, increases quality of the EUV beam.

According to an aspect of the invention, there is provided a mirror having a mirroring surface and a profiled coating layer having an outer surface, wherein one or more wedged elements are formed by the outer surface with respect to the mirroring surface, and wherein the one or more wedged elements have a wedge angle in a range of approximately 10-200 mrad.

According to another aspect of the invention there is provided a lithographic projection apparatus including a radiation system for supplying a projection beam of EUV radiation and further radiation. The radiation system includes a mirror as is set forth in the foregoing.

According to still another aspect of the invention there is provided a device manufacturing method. In an embodiment of the device manufacturing method, a projection beam of EUV radiation is provided. using a radiation system. The projection beam is patterned. The patterned beam is then projected onto a target portion of a layer of radiation-sensitive material. In the radiation system, a mirror as is set forth in the foregoing is used.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which.

DETAILED DESCRIPTION

Figure 1:
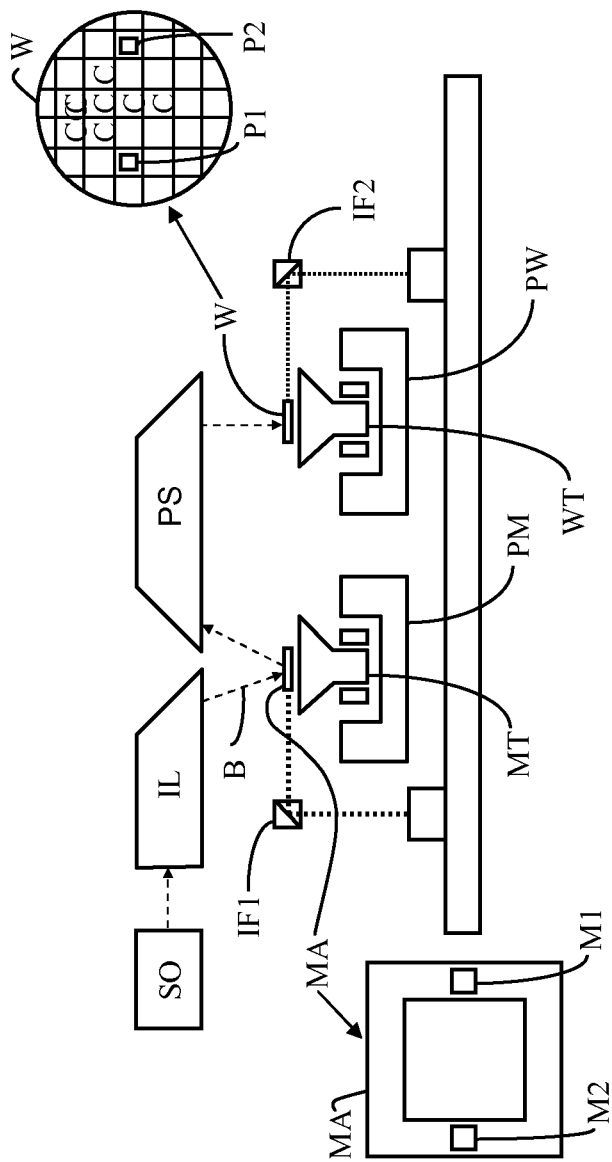
FIG. 1 depicts a lithographic apparatus according to an embodiment of the invention.

FIG. 1 schematically depicts a lithographic apparatus according to one embodiment of the invention. The apparatus includes:

an illumination system (illuminator) IL configured to condition a radiation beam B (e.g. UV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of substrate W.

Illumination system IL may include various types of optical components, such as refractive, reflective, magnetic, electromagnetic, electrostatic or other types of optical components, or any combination thereof, for directing, shaping, or controlling radiation.

Support structure MT supports, i.e. bears the weight of, patterning device MA. It holds patterning device MA in a manner that depends on the orientation of patterning device MA, the design of the lithographic apparatus, and other conditions, such as for example whether or not patterning device MA is held in a vacuum environment. Support structure MT can use mechanical, vacuum, electrostatic or other clamping techniques to hold the patterning device. Support structure MT may be a frame or a table, for example, which may be fixed or movable as required. Support structure MT may ensure that patterning device MA is at a desired position, for example with respect to projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

Patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is-reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system BD comprising, for example, suitable directing mirrors and/or a beam expander. In other cases the source may be an integral part of the lithographic apparatus. Source SO and illuminator IL, together with beam delivery system BD if required, may be referred to as a radiation system.

Illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, illuminator IL may comprise various other components, such as an integrator IN and a condenser CO. Illuminator IL may be used to condition the radiation beam, to have a desired uniformity and intensity distribution in its cross-section.

Radiation beam B is incident on the patterning device (e.g., mask MA), which is held on the support structure (e.g., mask table MT), and is patterned by the patterning device. Having traversed mask MA, radiation beam B passes through projection system PS, which focuses the beam onto a target portion C of substrate W. With the aid of second positioner PW and position sensor IF2 (e.g. an interferometric device, linear encoder or capacitive sensor), substrate table WT can be moved accurately, e.g. so as to position different target portions C in the path of radiation beam B. Similarly, first positioner PM and another position sensor IF1 can be used to accurately position mask MA with respect to the path of radiation beam B, e.g. after mechanical retrieval from a mask library, or during a scan. In general, movement of mask table MT may be realized with the aid of a long-stroke module (coarse positioning) and a short-stroke module (fine positioning), which form part of first positioner PM. Similarly, movement of substrate table WT may be realized using a long-stroke module and a short-stroke module, which form part of second positioner PW. In the case of a stepper (as opposed to a scanner) mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on mask MA, the mask alignment marks may be located between the dies.

The depicted apparatus could be used in at least one of the following modes:

1. In step mode, mask table MT and substrate table WT are kept essentially stationary, while an entire pattern imparted to the radiation beam is projected onto a target portion C at one time (i.e. a single static exposure). Substrate table WT is then shifted in the X and/or Y direction so that a different target portion C can be exposed. In step mode, the maximum size of the exposure field limits the size of target portion C imaged in a single static exposure.

2. In scan mode, mask table MT and substrate table WT are scanned synchronously while a pattern imparted to the radiation beam is projected onto a target portion C (i.e. a single dynamic exposure). The velocity and direction of substrate table WT relative to mask table MT may be determined by the (de-)magnification and image reversal characteristics of projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, mask table MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
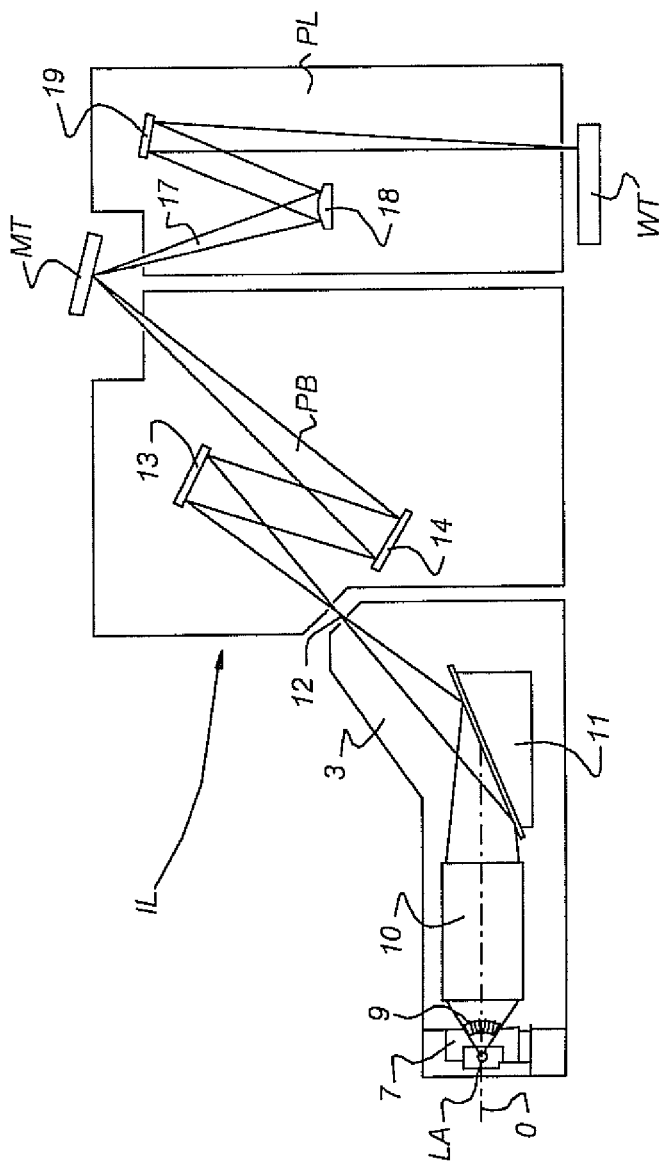
FIG. 2 depicts a side view of an EUV illumination system and projection optics of a lithographic projection apparatus according to FIG. 1.

FIG. 2 depicts a side view of an embodiment of an EUV illumination system and projection optics of a lithographic projection apparatus according to FIG. 1, including a radiation system 3 (i.e. "source-collector module"), an illumination system IL, and a projection system PL. Radiation system 3 is provided with a radiation source LA, which may comprise a discharge plasma source. Radiation source LA may employ a gas or vapor, such as Xe gas or Li vapor in which a very hot plasma can be created by a discharge between electrodes of the radiation source to emit radiation in the EUV range of the electromagnetic spectrum. The very hot plasma is created by causing a partially ionized plasma of an electrical discharge to collapse onto an optical axis 0. Partial pressure of 0.1 mbar of Xe, Li vapor or any other suitable gas or vapor may be required for efficient generation of the radiation.

When xenon is used, the plasma may radiate in the EUV range of about 13.5 nm. It will be appreciated that EUV radiation having a wavelength of about 6.7 nm is contemplated as well. The radiation emitted by radiation source LA may be led from a source chamber 7 to a contamination bather 9. Contamination bather 9 may comprise a channel structure such as, for instance, that described in detail in EP Application No. 1 057 079, which is incorporated herein by reference in its entirety.

Radiation system 3 (i.e. "source-collector module") includes a radiation collector 10 which may be formed by a grazing incidence collector. EUV radiation passed by radiation collector 10 is reflected off a grating spectral purity filter or mirror 11 to be focused in an intermediate focus 12 at an aperture. In accordance with an aspect of the invention, mirror 11 includes a profiled coating layer having an outer surface provided with wedged elements with respect to a mirroring surface of mirror 11, said wedged elements having a wedge angle in a range of approximately 10-200 mrad. As a result, undesirable wavelengths present in the radiation beam propagating from source LA are deflected away from intermediate focus 12. It will be appreciated that an absolute value of the wedge angle is determined by several factors. First, this value is determined by a path length between the mirror and a suitable following structure in the optical system, for example between the mirror and the intermediate focus. Additionally, a size of the optical element following the mirror in a downstream direction also influences the value of the wedge angle. In an embodiment, the wedge angle is about 50 mrad for a path length of about 2 meters between mirror 11 and intermediate focus 12, wherein intermediate focus 12 may be determined by, for example, approximately a 4 mm large slit. It will be appreciated that for other distances between mirror 11 and intermediate focus 12, the wedge angle may be scaled accordingly.

Projection beam PB is reflected in illumination system IL via normal incidence reflectors 13, 14 onto a reticle or mask positioned on reticle or mask table MT. A patterned beam 17 is formed which is imaged in projection optics system PL via reflective elements 18, 19 onto wafer stage or substrate table WT. More elements than shown may generally be present in the illumination system IL and the projection system PL.

It will be appreciated that, although embodiments of the invention are explained with reference to mirror 11, in general, a plurality of mirrors may be provided with the profiled coating layer, as is described in the foregoing. In particular, radiation collector 10, or normal incidence reflectors 13, 14 of FIG. 2, can be a mirror according to embodiments the invention. Preferably, a material of the coating layer is selected from at least one of: beryllium (Be), boron (B), carbon (C), phosphorus (P), potassium (K), calcium (Ca), scandium (Sc), bromine (Br), rubidium (Rb), strontium (Sr), yttrium (Y), zirconium (Zr), ruthenium (Ru), niobium (Nb), molybdenum (Mo), barium (Ba), lanthanum (La), cerium (Ce), praseodymium (Pr), protactinium (Pa) and uranium (U).

Figure 3:
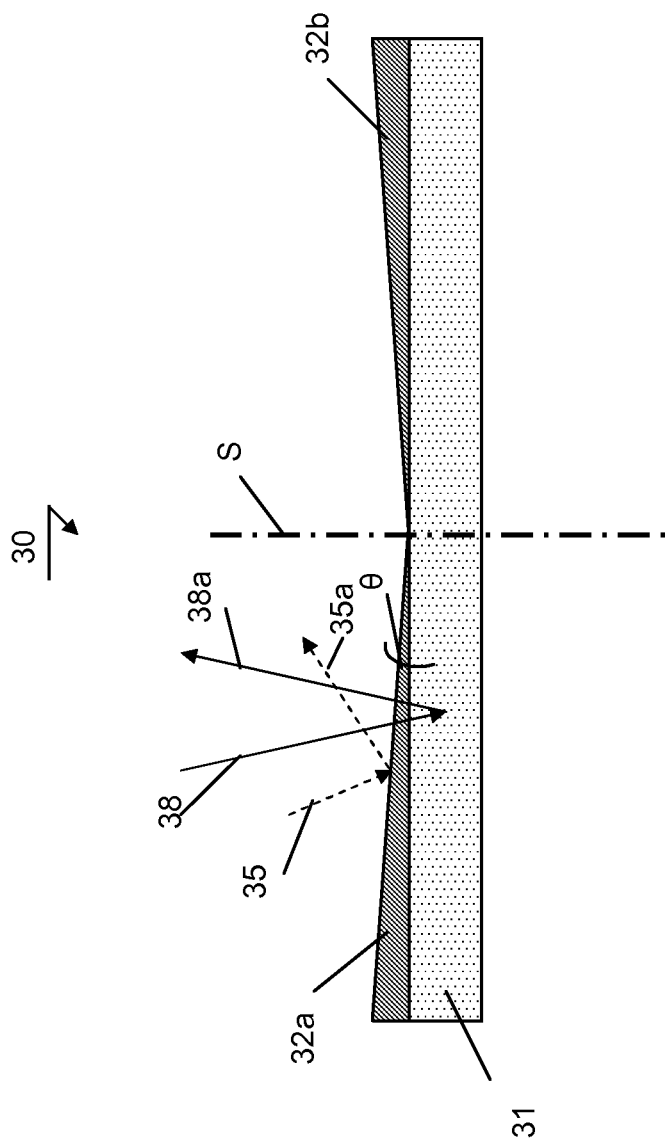
FIG. 3 depicts a mirror according to an embodiment of the invention.

A mirror 30 according to an embodiment of the invention is schematically shown in FIG. 3. In this embodiment, a spectral purity filter or a mirror 31 is provided with a profiled coating layer having wedged elements 32a, 32b. It will be appreciated that the term "layer" shall be construed as a continuous structure having a non-zero thickness.

It is possible that the profiled coating layer is provided with one, two, or more wedged structures. In a particular embodiment, the profiled coating layer may include two wedged elements, which may be symmetrical with respect to an imaginative symmetry axis S. It will be appreciated that the symmetry axis S may be defined with respect to the wedged elements and does not necessarily have to coincide with a centerline of the spectral purity filter or mirror 31. In an embodiment, the symmetry axis S and a centerline of the spectral purity filter or mirror 31 coincide.

In accordance with an embodiment of the invention, a beam of radiation may include EUV radiation 38 and a further radiation 35. When EUV radiation 38 and further radiation 35 impinge on the profiled coating, each of EUV radiation 38 and further radiation 35 undergoes a different interaction therewith. In an embodiment, EUV radiation 38 is substantially transmitted through the profiled coating layer having wedged elements 32a, 32b, while further radiation 35 is reflected at a surface of the wedged elements. As a result, the reflection angle for EUV 38 radiation is different than a reflection angle for further radiation 35, resulting in a substantial deflection of further radiation 38a away from a direction of propagation of reflected EUV beam 38a. In an embodiment, the angle θ is selected so that further radiation 35 is deflected away from an intermediate focus 12, shown in FIG. 2.

The mirror profiled with a coating layer according to an embodiment of the invention may be manufactured by arranging a suitable coating layer, for example including one or more of the following materials on a mirroring surface: Be, B, C, P, K, Ca, Sc, Br, Rb, Sr, Y, Zr, Ru, Nb, Mo, Ba, La, Ce, Pr, Pa, U. In an embodiment, for 13.5 nm EUV radiation, Mo, Y, Zr, Sr or Ru are used due to their low absorption for this wavelength. Providing a mirror of a lithographic apparatus with such a coating layer has an additional advantage that the coating layer acts as a protective layer of the mirroring surface, preventing contamination from being precipitated on the mirroring surface. As a result, an optical quality of the reflected EUV beam (such as reflected EUV beam 38a) does not decrease. It is found that by using a mirror according to an embodiment of the invention in an EUV lithographic apparatus, a suppression of about 100 times for undesirable radiation, like infrared (IR), visible (VIS), ultraviolet (UV) and deep ultraviolet (DUV) may be achieved.

The shape of the profiled coating layer shown in FIG. 3 may be obtained using different manufacturing steps. For example, the coating layer may be processed by diamond turning or by laser ablation. It will be appreciated that the resulting profiled coating layer also may have a non-zero thickness in regions between the wedged elements 32a, 32b.

Figure 4:
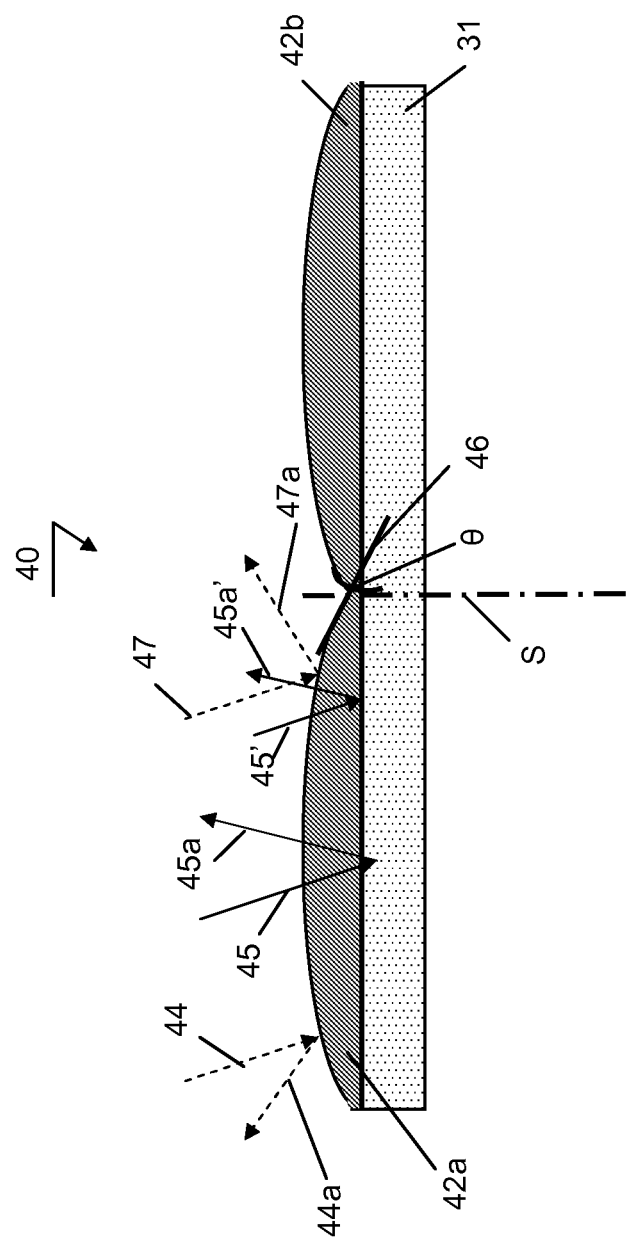
FIG. 4 depicts a mirror according to a further embodiment of the invention.

FIG. 4 depicts a mirror 40 according to a further embodiment of the invention, wherein an outer surface of the wedged elements 42a, 42b is curved. In this case, a value of the wedge angle may have a maximum value θ, determined by a tangent 46 and a surface of the structure 31, discussed with reference to FIG. 3, said maximum value θ being selected in the range of, in one example, approximately 10-200 mrad. In this configuration a reflection angle for the further radiation 44, 47, impinging on wedge element 42a varies along the surface of wedge element 42a. As a result, the further radiation may be deflected from an intermediate focus to form scattered stray light. The EUV radiation 45, 45', on the contrary, is reflected by the structure 31 yielding a beam of coplanar rays 45a, 45a' propagating in a useful direction, for example in a direction of the intermediate focus.

Also in this embodiment it is possible that structure 31 is provided with one, two or more wedge elements. Accordingly, it is possible that wedge elements 42a, 42b are symmetrically arranged with respect to an imaginative symmetry line S.

Wedge elements 42a, 42b may be manufactured using a plurality of suitable manufacturing methods, for example lithography or etching. Alternatively, convex wedged elements 42a, 42b may be formed by, for example, arranging a suitable set of communicating droplets on the mirroring surface of structure 31. In an embodiment, the droplets are formed from a material that does not wet the mirroring surface. For conventional mirrors used in a lithographic apparatus, Mo may be used as a droplet forming material. After the droplets are provided on the mirroring surface, structure 31 may be subjected to increased temperatures at which the droplets solidify forming a profiled coating layer having a convex outer surface.

Figure 5:
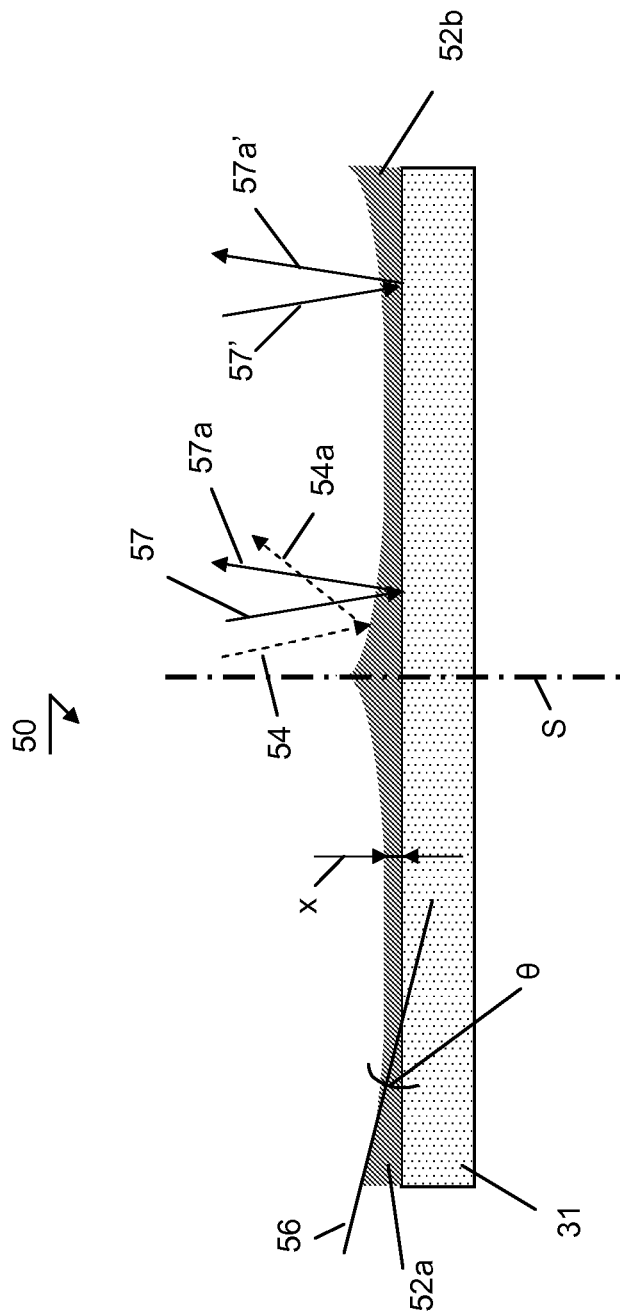
FIG. 5 depicts a mirror according to a still further embodiment of the invention.

FIG. 5 depicts a mirror 50 according to a still further embodiment of the invention. In this particular example, a profiled coating layer including wedged elements 52a, 52b is provided on a mirroring surface of a structure 31, discussed with reference to FIG. 3. Wedged elements 52a, 52b may be concave, having a variable wedge angle θ being formed by a tangent 56 and the mirroring surface of structure 31. Also in this embodiment, it is possible that the mirror 50 includes one, two or more wedge elements of type 52a. In an embodiment, two symmetrically arranged wedge elements 52a, 52b are provided on the mirroring surface.

Wedge elements 52a, 52b may be manufactured using, for example, laser ablation, wherein a concave cavity is formed substantially corresponding to a cross-section of a laser beam used for ablation. This embodiment may have an advantage at least with respect to the embodiment discussed with reference to FIG. 3 in that thickness x of the profiled coating layer may be minimized while preserving the integrity of the coating layer. A profiled coating layer having a minimized thickness may be advantageous for decreasing loss of intensity of the EUV beam due to non-zero absorption in the coating layer.

As is schematically demonstrated in FIG. 5, the concave surfaces may be used to deflect undesirable further radiation 54 into direction 54a. EUV beam 57, 57' undergoes reflection from structure 31 propagating in a useful direction 57a, 57a'. In an embodiment, the further radiation is deflected away from the intermediate focus, discussed with reference to FIG. 2. The wedge elements, discussed with reference to FIGS. 3-5, may be provided as respective profiles having annular symmetry. This may have an advantage with respect to deflection patterns for the undesirable further radiation.

Figure 6:
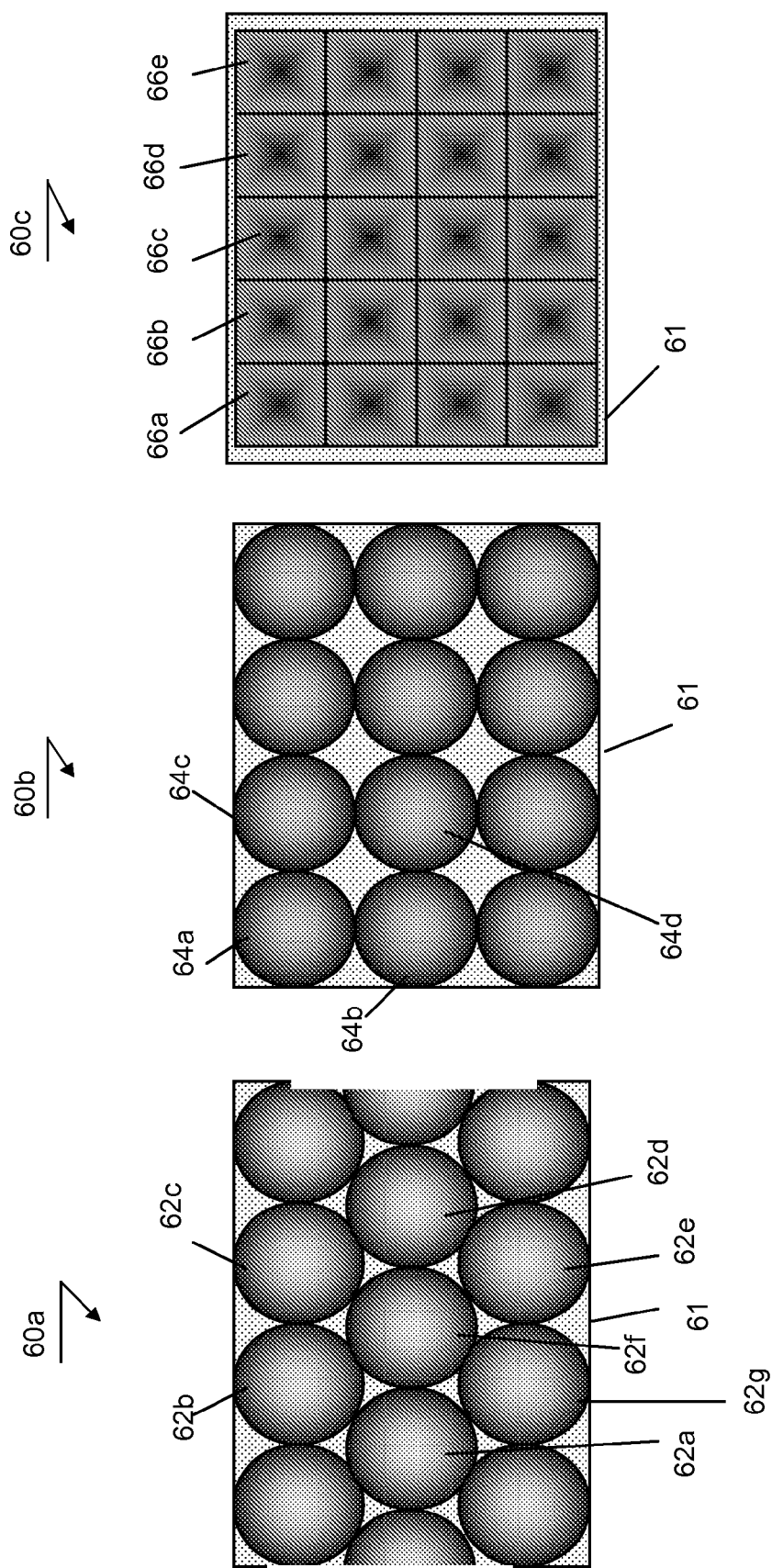
FIG. 6 depicts a top view of selected embodiments of a mirror provided with a profiled coating layer.

FIG. 6 depicts a top view of selected embodiments of a mirror provided with a profiled coating layer. View 60a presents schematically a top view of a mirror, for example a multi-layer mirror, covered by a profiled coating layer as is set forth in the foregoing. For clarity reasons, areas of the profiled coating layer between the wedged elements is shown as 61. The mirror is beyond the plane of the figure and is not depicted.

Wedged elements 62a, 62b, 62c, 62d, 62e, 62f, 62g may be configured according to any profile, including, but not limited to profiles discussed with reference to FIGS. 3-5. In particular, the wedged elements 62a, 62b, 62c, 62d, 62e, 62f, 62g may be arranged to have an increased thickness at respective peripheries of the wedged elements, or, alternatively, the wedged elements may have a decreased thickness at respective peripheries thereof.

View 60a schematically represents a configuration, wherein wedged elements 62a, 62b, 62c, 62d, 62e, 62f, 62g are arranged according a hexagonal pattern. This pattern may be suitably repeated to propagate along a surface area of the mirror in a suitable matrix.

View 60b schematically depicts an embodiment of a mirror including a profiled coating having wedged elements 64a, 64b, 64c, 64d, which are arranged in a rectangular pattern. It will be appreciated that the wedged elements may be arranged to have an increased thickness at respective peripheries, or, alternatively, the wedged elements may have a decreased thickness at respective peripheries.

View 60c presents schematically a mirror according to a still further embodiment of the invention, wherein wedged elements 66a, 66b, 66c, 66d, 66e are constructed with a pyramidal profile. A mirroring surface of the mirror may be covered by the profiled coating layer, wherein wedged elements 66a, 66b, 66c, 66d, 66e may be arranged in rows and columns, thereby forming a suitable rectangular matrix.

It will be appreciated that although views 60a, 60b and 60c schematically depict regular patterns of substantially equally sized wedged elements, it is also possible for the profiled coating layer to be constructed with irregularly positioned wedged elements. Additionally or alternatively, the wedged elements may be differently sized. It will be further appreciated that in case the mirror as shown in FIG. 6 is to be used in the lithographic apparatus operable using EUV radiation, for example in the range of about 6.7-13.5 nm, a period between subsequent wedged elements in the matrix may be advantageously set to a value at least equal to a wavelength of the EUV radiation.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein, where the context allows, encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of or about 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A mirror having a mirroring surface comprising:
a single profiled coating layer having an outer surface provided with two wedged elements formed with respect to the mirroring surface,
wherein the two wedged elements have a wedge angle in a range of about 10-200 mrad and the two wedged elements are located next to each other and are symmetric with respect to a symmetry axis between them, and
wherein extreme ultraviolet (EUV) radiation of a radiation beam is transmitted through the profiled coating layer, while other wavelengths of the radiation beam are reflected at the outer surface of the two wedged elements.

2. The mirror according to claim 1, wherein the profiled coating layer extends substantially over the mirroring surface.

3. The mirror according to claim 1, wherein the outer surface of the profiled coating layer is concave.

4. The mirror according to claim 1, wherein a material forming the profiled coating layer comprises Be, B, C, P, K, Ca, Sc, Br, Rb, Sr, Y, Zr, Ru, Nb, Mo, Ba, La, Ce, Pr, Pa or U.

5. The mirror according to claim 1, wherein the profiled coating layer comprises three wedged elements arranged in a substantially regular matrix over a surface of the mirror.

6. The mirror according to claim 5, wherein said matrix is rectangular or hexagonal.

7. The mirror according to claim 1, wherein the outer surface of the profiled coating layer is curved.

8. The mirror according to claim 7, wherein the profiled coating layer comprises a set of solidified droplets.

9. The mirror according to claim 8, wherein the droplets are formed from a material not wetting the mirroring surface.

10. A lithographic projection apparatus comprising:
a radiation system configured to supply a projection beam of EUV radiation and a further radiation,
wherein the radiation system comprises a mirror having a mirroring surface comprising a single profiled coating layer having an outer surface provided with two wedged elements formed with respect to the mirroring surface, wherein the two wedged elements have a wedge angle in a range of about 10-200 mrad and the two wedged elements are located next to each other and are symmetric with respect to a symmetry axis between them, and wherein the EUV radiation is transmitted through the profiled coating layer, while other wavelengths of the projection beam are reflected at the outer surface of the two wedged elements.

11. The lithographic projection apparatus according to claim 10, wherein said radiation system is configured to focus the EUV radiation onto an intermediate focus, the mirror being configured to deflect the further radiation away from the intermediate focus.

12. The lithographic apparatus according to claim 10, wherein a period between the two wedged elements is at least equal to a wavelength of the EUV radiation.

13. A device manufacturing method comprising:
supplying a projection beam of EUV radiation and other wavelengths of radiation using a radiation system comprising a mirror having a mirroring surface comprising a single profiled coating layer having an outer surface provided with two wedged elements formed with respect to the mirroring surface, wherein the two elements have a wedge angle in a range of about 10-200 mrad and the two wedged elements are located next to each other and are symmetric with respect to a symmetry axis between them, and wherein the EUV radiation is transmitted through the profiled coating layer, while the other wavelengths are reflected at the outer surface of the two wedged elements;
patterning the EUV radiation; and
projecting the patterned beam onto a target portion of a layer of radiation-sensitive material.

* * * * *